US006552544B2

(12) United States Patent
Wong et al.

(10) Patent No.: US 6,552,544 B2
(45) Date of Patent: Apr. 22, 2003

(54) DETUNABLE COIL ASSEMBLY AND METHOD OF DETUNING RF COIL FOR MRI

(75) Inventors: Wai Ha Wong, San Jose, CA (US); Alan R. Rath, Fremont, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/828,319

(22) Filed: Apr. 5, 2001

(65) Prior Publication Data

US 2002/0145427 A1 Oct. 10, 2002

(51) Int. Cl.[7] .................................................. G01V 3/00
(52) U.S. Cl. ........................................ 324/318; 324/322
(58) Field of Search ................................ 324/318, 320, 324/322, 307, 309

(56) References Cited

U.S. PATENT DOCUMENTS

| | | | | |
|---|---|---|---|---|
| 4,638,253 A | * | 1/1987 | Jaskolski et al. | 324/311 |
| 4,717,881 A | * | 1/1988 | Flugan | |
| 4,725,779 A | * | 2/1988 | Hyde et al. | |
| 4,763,076 A | | 8/1988 | Arakawa et al. | 324/322 |
| 4,812,764 A | * | 3/1989 | Bendall | 324/318 |
| 4,833,409 A | | 5/1989 | Eash | 324/318 |
| 5,323,113 A | * | 6/1994 | Cory et al. | 324/307 |
| 5,445,153 A | * | 8/1995 | Sugie et al. | 324/318 |
| 5,453,692 A | * | 9/1995 | Takahashi et al. | 324/318 |
| 5,585,721 A | * | 12/1996 | Datsikas | 324/318 |
| 5,898,306 A | * | 4/1999 | Liu et al. | 324/318 |
| 5,903,150 A | * | 5/1999 | Roznitzky | 324/318 |
| 6,137,291 A | * | 10/2000 | Mitamura et al. | 336/150 |
| 6,198,962 B1 | * | 3/2001 | Su | 324/318 |
| 6,211,677 B1 | * | 4/2001 | Burl et al. | |

FOREIGN PATENT DOCUMENTS

| | | |
|---|---|---|
| JP | 01094834 | 4/1989 |
| JP | 01213559 | 8/1989 |

OTHER PUBLICATIONS

Stewart C. Bushong; Magnetic Resonance Imaging physical and biological principles; second edition; 1996, Chapter 12, pp. 144–158).*
Article by C.E. Hayes, et al., entitled "An Efficient, Highly Homogeneous Radiofrequency Coil for Whole–Body NMR Imaging at 1.5T" published in *Journal of Magnetic Resonance*, 63, pp. 622–628 (1985).
Yoda Kiyoshi, High Frequency Probe for NMR and NMR signal measuring method Jun. 10, 1987, Patent Abstract of Japan pp. 1–16.*
Yoda Kiyoshi, Probe for NMR and its adjusting method Feb. 23, 1988, Patent Abstract of Japan pp. 1–12.*

* cited by examiner

Primary Examiner—Edward Lefkowitz
Assistant Examiner—Dixomara Varges
(74) Attorney, Agent, or Firm—Bella Fishman; Edward H. Berkowitz

(57) ABSTRACT

A detunable coil assembly includes a main coil which resonates at a specified resonance frequency and a switchable detuning coil which, when switched on, becomes inductively coupled to the main coil and serves to detune it from its resonance frequency. The detuning coil and the main coil are electrically insulated from each other. The main coil may be of a multiply tuned kind and it may be detuned from more than one of its specified resonance frequencies at the same time by switching on the detuning coil.

13 Claims, 3 Drawing Sheets

DETUNABLE COIL ASSEMBLY AND METHOD OF DETUNING RF COIL FOR MRI

FIELD OF THE INVENTION

This invention is in the technical field of magnetic resonance imaging (MRI) using nuclear magnetic resonance (NMR) phenomenon and relates to a detunable coil assembly with a simplified design and capable of detuning both quadrature modes at the same time.

BACKGROUND OF THE INVENTION

It has been known for producing images by utilizing NMR to employ separate specially designed coils for producing a radio frequency (RF) excitation field and receiving the NMR signal. The excitation is commonly provided by a large-volume field coil (or a "volume coil") capable of generating a homogeneous RF magnetic field throughout a relatively large region such as around the entire body of a subject to be imaged. For receiving the NMR signals from specified localized portions of the body, smaller coils (such as so-called "surface coils" which generally have excellent sensitivity and poorer B1 homogeneity) is used for detailed imaging. Since both the excitation coil and the receiving coil are tuned to resonate at the same frequency, they would interact, or couple, with each other and thereby cause non-uniformity in the excitation field.

In order to minimize such coupling, it has been known to build both the volume coil for excitation an the surface coil with an active detuning feature. While the excitation volume coil excites the sample, the surface coil is detuned to a different frequency. Immediately after the excitation phase, the volume coil is detuned to an off-resonance frequency and the surface coil is tuned back to the resonance frequency for detection. Throughout herein, therefore, "detuning" will mean a frequency shift by at least the sum of the half widths of the resonance peaks of the two coils. For the purpose of these detuning operations, it has also been knownto make use of pin diodes as switches because they must be carried out within a few microseconds.

Prior art apparatus and methods for actively detuning (or "disabling") an NMR volume coil include those described in U.S. Pat. Nos. 4,833,409 (issued May 23, 1989 to M. G. Eash) and 4,763,076 (issued Aug. 9, 1988 to M. Arakawa, et al.). These prior art apparatus are characterized as having a pin diode-containing switching circuit electrically connected to the RF circuit of the field coil, and this makes it difficult to handle the currents and the problem of electrical noise becomes severe.

SUMMARY OF THE INVENTION

It is therefore an object of this invention to provide a detunable coil assembly with a simple design with which the detuning of a field coil for MRI can be accomplished.

It is another object of this invention to provide such a coil assembly with which frequencies of both quadrature modes of the field coil can be shifted at the same time.

It is still another object of this invention to provide a method of detuning an RF field coil for MRI with a detuning coil of a simple design.

It is a further object of this invention to provide a method of detuning a quadrature field coil for MRI from frequencies of both its quadrature modes.

A detunable coil assembly embodying this invention is characterized not only as comprising a main coil which resonates at a specified resonance frequency and a switchable detuning coil which, when switched on, becomes inductively coupled to the main coil so as to detune it from its resonance frequency but also wherein the detuning coil and the main coil are electrically insulated from each other. Because the main coil which serves as the field coil in an MRI application is physically separated from the low-frequency switching circuit for the detuning coil, the circuit design is much more simplified without adversely affecting the performance. The invention is applicable to situations where the main coil is a quadrature birdcage coil or a multiply tuned coil with a coil array and the main coil can be detuned from more than one of its resonance frequencies at the same time.

BRIEF DESCRIPTION OF THE DRAWINGS

The accompanying drawings, which are incorporated in and form a part of the disclosure, illustrate embodiments of the invention and, together with the description, serve to explain the principles of the invention. In the drawings.

Throughout herein some like components are indicated by the same numerals even where they are components of different coils and may not necessarily be described repetitiously.

DETAILED DESCRIPTION OF THE INVENTION

Figure 1:
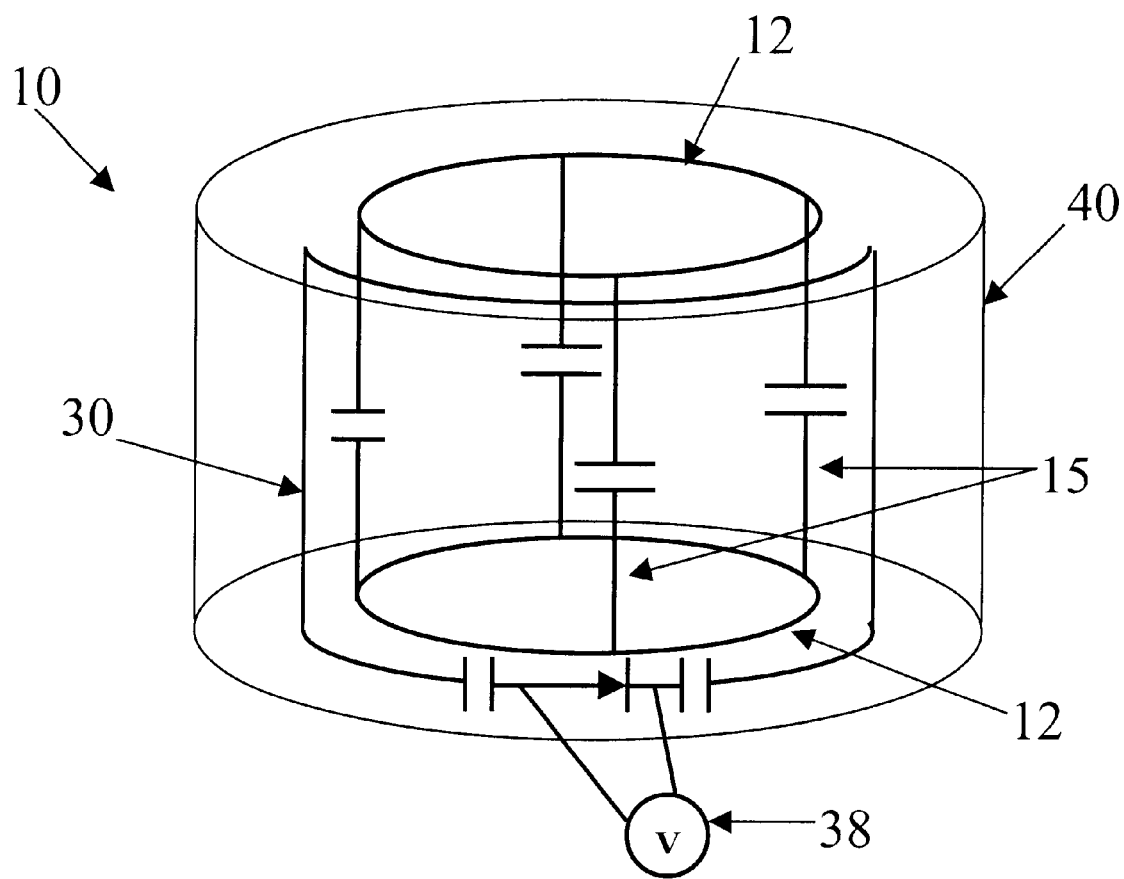
FIG. 1 is a schematic diagram for generally showing the structure of a detunable coil assembly embodying this invention.

FIG. 1 shows, although very schematically, the general structure of a detunable coil assembly embodying this invention, characterized not only as having a cylindrical field coil for excitation (herein referred to as "the main coil 10") and a switchable detuning coil 30 but also wherein the main coil 10 and the detuning coil 30 are in an electrically insulated relationship with each other but are close enough to each other such that, when the switchable detuning coil 30 is switched on, or closed, they are inductively coupled and the detuning coil 30 serves to detune the main coil 10 as a result of this inductive coupling.

FIG. 1 shows a cylindrical birdcage coil of a known kind such as disclosed by C. E. Hayes, et al. in "An Efficient, Highly Homogeneous Radio Frequency Coil for Whole Body NMR Imaging at 1.5 T" (J. Magn. Reson., 63, 622–628, (1985)), having a pair of conductive loop elements 12 separated from each other axially (with respect to the central axis of the cylindrically shaped main coil 10) and a plurality of conductive segments ("the legs 15) containing capacitors and extending between and electrically interconnecting the loop elements 12.

Figure 2:
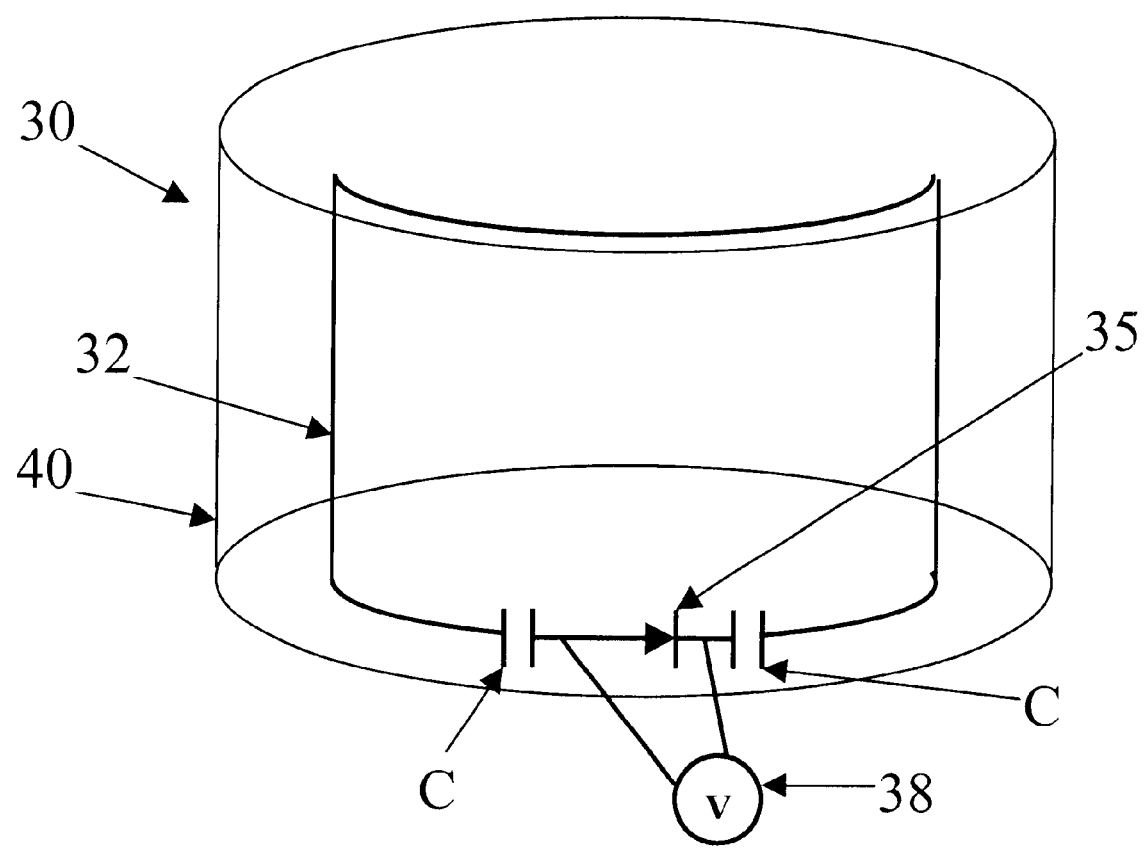
FIG. 2 is a schematic diagram for generally showing the structure of a detuning coil embodying this invention.

FIG. 2 shows a detuning coil 30 according to one embodiment of the invention together with a generally cylindrically shaped shield 40 for surrounding both the main coil 10 and the detuning coil 30 such that the detuning coil 30 will be disposed between the main coil 10 and the shield 40. The detuning coil 30 according to this embodiment comprises a capacitor-containing electrically conductive wire (such as a Cu wire) 32 and a pin diode 35 connected and arranged together in a single closed loop form. The area of this single closed loop form extends about 180 degrees azimuthally, or around the center axis of the cylindrically shaped main coil 10 (not shown in FIG. 2). The detuning coil 30 is positioned closely to the main coil 10 but is in an electrically insulated manner therefrom. The capacitors C inserted in the detuning coil 30 are for dc block and not for tuning. The pin diode 35 is connected to a voltage source 38. When the pin diode 35 is not switched on (or is not electrically connected to its voltage source 38), there is no inductive coupling between the main coil 10 and the detuning coil 30. The detuning coil 30 is disposed sufficiently closely to the main coil 10 such that, when the pin diode 35 is switched on, or is closed, the detuning coil 30 and the main coil 10 are inductively coupled, as a result of which the main coil 10 is detuned.

It is to be noted that the main coil 10 is illustrated in FIG. 1 as a quadrature coil, the two quadrature modes being apart by 90 degrees. The detuning coil 30 extending azimuthally by about 180 degrees, as explained above, is thus capable of detuning the main coil 10 from both of its quadrature modes at the same time.

Figure 3:
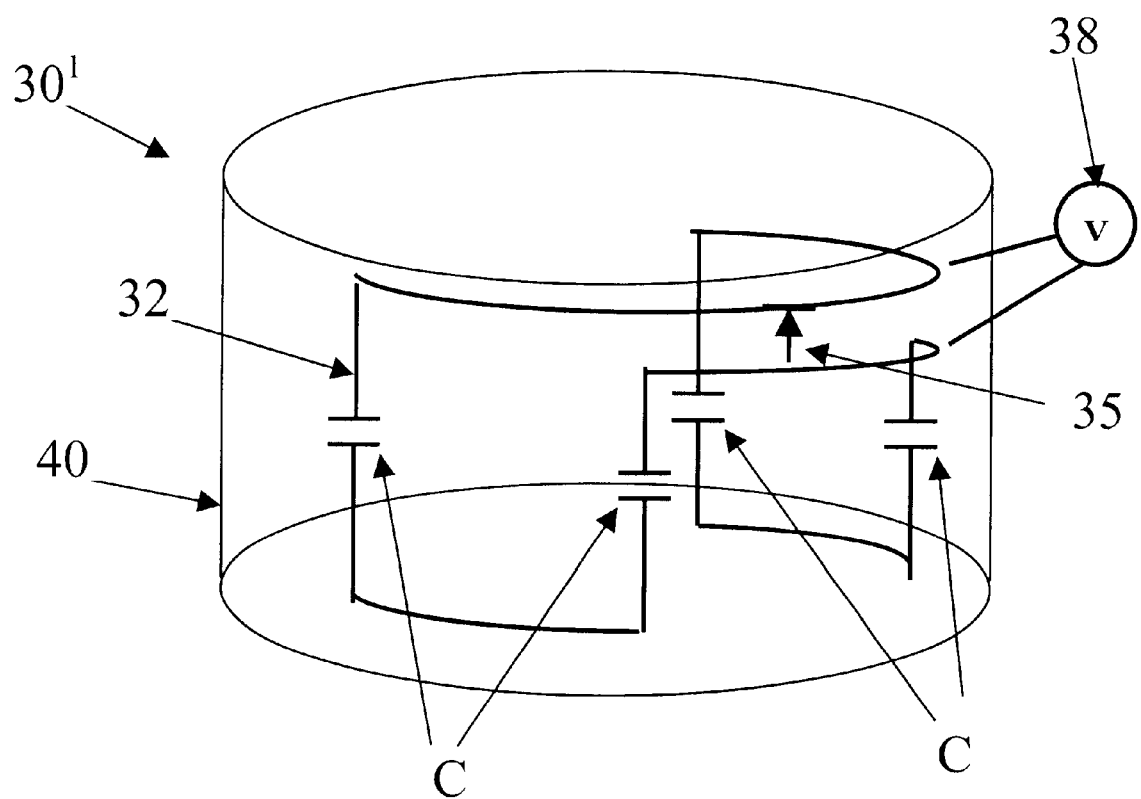
FIG. 3 is a schematic diagram for generally showing the structure of another detuning coil embodying this invention.

FIG. 3 shows another detuning coil 30' according to a different embodiment of this invention, numeral 40 again indicating a cylindrical shield 40 surrounding both the main coil 10 and the detuning coil 30'. The detuning coil 30' according to this embodiment is different from the detuning coil 30 shown in FIG. 2 in that the capacitor-containing conductive wire 32 and the pin diode 35 are connected and arranged in a different pattern. According to the embodiment shown in FIG. 3, the wire 32 is itself arranged in a closed loop form and the pin diode connects two points on this closed loop form such that two loop segments are thereby formed by sharing the pin diode 35 which serves as a portion of each of the two loop segments. The two loop segments are opposite each other (or off from each other by 180 degrees) with respect to the center axis of the cylindrically shaped main coil 10 and each extend azimuthally by about 90 degrees. Thus, this detuning coil 30' is for detuning only one of the quadrature modes. The detuning coil 30' is advantageous in that a larger inductive coupling can be obtained.

Although the invention has been described by way of only a limited number of examples, these examples are not intended to limit the scope of the invention. Many modifications and variations are possible within the scope of the invention. For example, the main coil may be a multiply tuned coil assembly consisting of a plurality of coils (or a coil array) which may be birdcage coils assembled coaxially one inside another and the detuning coil may serve to detune the main coil from all of its resonance frequencies. The multiply tuned coil may be tuned to a same frequency and the detuning coil may serve to detune a part of the coil array.

What is claimed is:

1. A detunable coil assembly comprising:
    a cylindrical main coil which resonates at a specified frequency; and
    a detuning coil comprising a switch and at least one loop proximate said main coil and electrically insulated therefrom, said at least one loop electrically terminating at said switch for establishing continuity through said at least one loop whereby said detuning coil is inductively coupled to said main coil and said main coil in coupled combination with said detuning coil exhibits a resonance frequency different from said specified resonance frequency.

2. The detunable coil assembly of claim 1 wherein said main coil is a quadrature coil having two resonance frequencies and wherein said detuning coil serves to detune said main coil from both of said resonance frequencies simultaneously.

3. The detunable coil assembly of claim 1 wherein said main coil is multiply tuned, resonating at more than one resonance frequency, and wherein said detuning coil serves to detune said main coil from each of said more than one resonance frequencies simultaneously.

4. The coil assembly of claim 1 wherein said main coil is a cylindrical birdcage coil having a pair of conductive loop elements separated from each other axially and a plurality of conductive segments extending between and electrically interconnecting said pair of loop elements.

5. The coil assembly of claim 2 wherein said main coil is a cylindrical birdcage coil having a pair of conductive loop elements separated from each other axially and a plurality of conductive segments extending between and electrically interconnecting said pair of loop elements.

6. The coil assembly of claim 1 further comprising a shield which surrounds both said main coil and said detuning coil, said detuning coil being disposed between said main coil and said shield.

7. The coil assembly of claim 1 wherein said detuning coil comprises a capacitor-containing conductive wire, at least one pin diode and a voltage source for supplying voltage to switch on said one pin diode to thereby inductively couple said main coil and said detuning coil.

8. The coil assembly of claim 2 wherein said detuning coil comprises a capacitor-containing conductive wire, at least one pin diode and a voltage source for supplying voltage to switch on said one pin diode to thereby inductively couple said main coil and said detuning coil.

9. A method of detuning a main coil for MRI, said main coil resonating at one or more specified resonance frequencies, said method comprising the steps of:
    providing a switchable detuning coil which is electrically insulated from said main coil but is disposed with respect to said main coil so as to inductively couple therewith when switched on; and
    switching on said detuning coil and thereby inductively coupling said detuning coil with said detuning coil, wherein said main coil is detuned from the specified resonance frequencies.

10. The method of claim 9 wherein said detuning coil includes one or more pin diodes and the step of switching on said detuning coil includes electrically connecting said one or more pin diodes to a voltage source.

11. The method of claim 9 wherein said main coil is a quadrature coil having two resonance frequencies and wherein said detuning coil detunes said main coil from both of said resonance frequencies simultaneously.

12. The method of claim 9 wherein said main coil is a cylindrical birdcage coil having a pair of conductive loop element separated from each other axially and a plurality of conductive segments extending between said loop elements.

13. The method of claim 9 further comprising the step of providing a shield which surrounds both said main coil and said detuning coil, said detuning coil being disposed between said main coil and said shield.

* * * * *